(12) United States Patent
Kawata

(10) Patent No.: US 6,403,971 B1
(45) Date of Patent: Jun. 11, 2002

(54) BEAM-ADJUSTMENT METHODS AND APPARATUS FOR CHARGED-PARTICLE-BEAM MICROLITHOGRAPHY

(75) Inventor: Shintaro Kawata, Saitama-ken (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/397,453

(22) Filed: Sep. 16, 1999

(30) Foreign Application Priority Data

Sep. 17, 1998 (JP) .......................................... 10-280497

(51) Int. Cl.[7] .............................................. H01J 37/304
(52) U.S. Cl. ..................... 250/491.1; 430/4; 250/492.2; 250/492.23
(58) Field of Search ........................... 250/491.1, 492.2, 250/492.23; 430/4

(56) References Cited

U.S. PATENT DOCUMENTS

| | | |
|---|---|---|
| 5,079,112 A | 1/1992 | Berger et al. |
| 5,130,213 A | 7/1992 | Berger et al. |
| 5,260,151 A | 11/1993 | Berger et al. |
| 5,545,902 A * | 8/1996 | Pfeiffer et al. ........... 250/492.2 |
| 6,180,289 B1 * | 1/2001 | Hirayanagi .................... 430/5 |

* cited by examiner

Primary Examiner—Sandra O'Shea
Assistant Examiner—Zia R. Hashmi
(74) Attorney, Agent, or Firm—Klarquist Sparkman LLP

(57) ABSTRACT

Methods are provided for performing axial alignment of the optical system in a charged-particle-beam (e.g., electron-beam) microlithographic exposure apparatus employing an illumination beam and a scattering-type reticle. The microlithographic exposure apparatus projects and forms an image of a patterned beam that has passed through a reticle onto a substrate (e.g., semiconductor wafer). The reticle can be a scattering-stencil mask in which feature-defining cutouts are formed in a membrane that transmits an illumination beam while scattering the beam. A contrast aperture is disposed at the beam-convergence plane of the projection lens, i.e., at the Fourier plane of the reticle surface. Axial alignment is performed using an adjustment reticle having a "white subfield" (in a scattering-stencil reticle, a cutout area covering the entire subfield) and a "black subfield" (in a scattering-stencil reticle, a subfield consisting entirely of a reticle membrane lacking any cutouts).

22 Claims, 2 Drawing Sheets

BEAM-ADJUSTMENT METHODS AND APPARATUS FOR CHARGED-PARTICLE-BEAM MICROLITHOGRAPHY

FIELD OF THE INVENTION

This invention pertains to charged-particle-beam (CPB, e.g., electron-beam) microlithography systems. More specifically, the invention pertains to methods and apparatus for adjusting the charged particle beam used in such systems, especially where contrast is obtained in a projected image according to the degree of scattering of the beam from a reticle in which a one-shot transfer field is relatively large, and a large proportion of the beam illuminating the reticle passes with little absorption through the entire reticle.

BACKGROUND OF THE INVENTION

Electron-beam (as a representative charged particle beam) microlithography systems are attracting greater attention for use in the manufacture of semiconductor devices. Currently, practical use of such systems is mainly limited to developing prototypes of semiconductor devices (e.g., integrated circuits) and for making small production runs of specialized and/or custom devices.

In the earliest electron-beam microlithography systems, the beam is narrowed to a fine point and is scanned in a manner by which the pattern is traced line-by-line (i.e., "written") on the surface of a substrate. These systems are termed "spot-beam scanning" systems. Such systems exhibit extremely low "throughput" (i.e., number of wafers that can be processed per unit time).

More recent electron-beam systems employ a "variable-shaped" beam and tend to exhibit higher throughput. In such systems, the transverse dimensions of the beam are larger than in a spot-beam scanning system. In addition, the transverse profile and area of the beam can be changed to some extent in a variable-shaped-beam system.

Other conventional electron-beam systems, termed "cell-projection" systems, are typically used whenever the pattern to be "transferred" to the substrate comprises a relatively large area in which a particular small portion of the pattern is repeated many times (such as in a pattern for a memory chip comprising a large number of identical memory cells wherein each memory cell represents the repeated small portion). The highly repeated portion of the pattern is represented by a cell (approximately 5 $\mu$m×5 $\mu$m on the substrate) that is exposed multiple times on different respective regions of the substrate.

Yet another conventional approach involves dividing the reticle pattern into multiple "exposure units" or "subfields" each defining a respective portion of the overall pattern. Such a reticle is termed a "divided" or "segmented" reticle. The exposure units are exposed individually in an ordered manner using an illumination-optical system located upstream of the reticle and a projection-optical system located between the reticle and the substrate. Such a system is termed a "divided-pattern" projection-transfer system. As the exposure units are imaged on the substrate, they are "stitched" together in the proper order to form, after all the exposure units have been exposed, the entire pattern on the substrate.

In cell-projection systems, so-called "absorption-stencil reticles" are generally used. In such reticles, pattern features are represented as corresponding cutouts formed in and extending through the thickness dimension of a relatively thick (normally about 20 $\mu$m thick) silicon membrane. When an "illumination beam" impinges on such a reticle, portions of the beam passing through the reticle form a "patterned beam" that propagates downstream away from the reticle. To produce the pattern in the patterned beam, portions of the illumination beam pass through the cutouts (in the same manner as light through a window) and experience little to no scattering or absorption. Other portions of the illumination beam impinge on the non-cutout portions of the reticle (i.e., on the membrane) and are thereby absorbed. Absorption-stencil reticles are also used in divided-pattern projection-transfer systems.

To increase throughput, various schemes for increasing beam current have been investigated. However, with substantial increases in beam current, absorption-stencil reticles are impractical because electrons absorbed by the reticle membrane caused heating of the reticle. Such heating caused major problems with thermal expansion of the reticle. To solve this problem, "scattering-stencil reticles" were proposed.

In a scattering-stencil reticle, most of the electrons impinging on the reticle membrane are transmitted through the reticle rather than absorbed by the membrane. However, such electrons tend to be significantly scattered or diffused as they pass through the membrane. In a scattering-stencil reticle, as in an absorption stencil reticle, electrons passing through the cutouts are not scattered. Image contrast is obtained by placing a contrast aperture (that blocks electrons scattered by the reticle to prevent such electrons from propagating to the substrate) at or near a beam-convergence plane of the projection-optical system. I.e., the contrast aperture is placed at the Fourier plane, in the projection-optical system, of the reticle plane. Thus, scattered electrons that would otherwise impair image contrast are prevented from propagating to the image on the substrate.

With a stencil reticle, an island-shaped membrane feature cannot be disposed at the center of a cutout in the surrounding membrane because the island-shaped membrane feature would have no physical support. This is termed the "donut-feature" problem. To solve this problem, at least the surrounding cutout is split between two "complementary" exposure units of the reticle. Each split portion is separately projected and exposed onto the substrate. During exposure of the two exposure units, each split portion is positioned on the substrate such that the two cutouts are stitched together to form the exposed region surrounding the island-shaped non-exposed region. This method is termed dividing a reticle pattern into complementary pattern portions. Unfortunately, dividing a reticle pattern into complementary pattern portions requires two separate exposures to image the pattern portion including the island-shaped feature. The need to perform two exposures rather than one decreases throughput by a corresponding amount.

To solve the donut-feature problem, a "scattering-membrane reticle" can be used that comprises a relatively thin (e.g., 2 $\mu$m thick) electron-transmissive reticle membrane without cutouts. Pattern features are defined on such a reticle by a corresponding pattern of an electron-scattering material layered on the membrane. As electrons of the illumination beam pass through the membrane, virtually no electron scattering occurs. However, passage of electrons of the illumination beam through the electron-scattering material causes substantial electron scattering. A scattering membrane reticle improves throughput because island features can be projected onto the substrate without the need for complementary exposure units.

In the electron-optical system (comprising the illumination-optical system and the projection-optical system) of a conventional electron-beam microlithography apparatus, it is necessary occasionally to adjust the axial alignment, focal position, and/or the amount of astigmatism correction exhibited by the electron-optical system. For axial alignment, the respective excitation currents or voltages applied to the projection lenses and/or deflectors are set to "standard conditions" that cause the electron beam to pass through the center of the contrast aperture. Such an axial alignment is typically performed whenever, for example, an exposure-pattern lot is changed or whenever periodic adjustments are made to the microlithography apparatus.

In spot-beam scanning systems, since the beam diameter is very small at less than 1 $\mu$m, beam axial alignment can be performed using methods as used in scanning electron microscopy. For instance, the beam is scanned over a reference plane (represented by the reticle surface or the substrate surface) and the location of the beam axis is accurately determined by detecting and analyzing signals created by electrons in the scanning beam (e.g., absorption-current signal, backscattered-electron signal, secondary electron signal, etc.). Similar methods can be employed in variable-shaped-beam systems in which the beam diameter can be adjusted down to a very small diameter.

A cell-projection system can employ a variable-shaped beam, especially to form on the substrate portions of the pattern that are not repeated. Whenever an absorption stencil reticle is used with such a system, axial alignment can be performed in a manner substantially identical to that used in a spot-beam scanning system. This is because a spot beam can be formed using the variable-shaped beam system.

However, with a divided-pattern projection-transfer system, the beam dimension is relatively large at $(1 \text{ mm})^2$ at the mask and $(0.25 \text{ mm})^2$ at the substrate. Such a wide beam causes excessive dispersion of signals that would otherwise be useful for axial alignment of the beam, such as a backscattered-electron signal from an axial alignment pattern, for reliable use in axially aligning the beam. As a result, in contrast to axial alignment methods as used in spot-beam scanning systems or variable-shaped beam systems, the signal is inadequate for use in making sufficiently accurate determinations of beam axial alignment.

In addition, whenever a scattering reticle is used, such as a scattering-stencil reticle or a scattering-membrane reticle, the center of the beam cannot be found by conventional methods. This is because some of the highly scattered particles can pass through the contrast aperture together with particles that are less scattered, making it difficult to perform axial alignment.

Divided-pattern projection-transfer systems normally do not include a mechanism for shaping the beam in a variable manner; therefore, the beam cannot be stopped down sufficiently for axial alignment. Also, beam diameter conventionally cannot be decreased using a reticle because the resulting beam-current density would be too low to provide a sufficient signal-to-noise (S/N) ratio in the beam-reflection signal.

SUMMARY OF THE INVENTION

The present invention addresses the shortcomings of conventional methods as summarized above. An object of the invention is to provide adjustment methods for electron-beam and other charged-particle-beam (CPB) microlithographic exposure apparatus that are suitable for performing axial and other alignments of the optical systems of such apparatus.

According to one aspect of the invention, methods are provided for performing a beam alignment in a CPB microlithography apparatus utilizing a segmented scattering-stencil reticle. The apparatus includes an illumination-optical system that illuminates a region of a segmented reticle defining a pattern of features to be transferred to a sensitive substrate using an illumination beam. The apparatus also includes a projection-lens system that projects a patterned beam, formed by passage of the illumination beam through the illuminated region of the reticle, carrying an image of the illuminated region onto the sensitive substrate. In a representative embodiment of the method, a segmented scattering-stencil reticle is provided in which the features are defined by corresponding cutouts in a reticle membrane that transmits the illumination beam but scatters particles in the illumination beam as the illumination beam passes through the reticle membrane. The reticle comprises a "black" subfield and a "white" subfield each sized similarly to an exposure unit of the reticle. The reticle is placed at an axial location at which the black and white subfields can be individually illuminated by the illumination beam in a manner similarly to illumination of an exposure unit of the reticle by the illumination beam. A contrast aperture, serving to block passage therethrough of charged particles of the patterned beam scattered by passage through the reticle, is placed substantially at a beam-convergence plane of the projection lens. (Such a plane is also the Fourier plane of a plane defined by the reticle.) The contrast aperture prevents the scattered particles from propagating to the sensitive substrate. The white and black subfields are selectively illuminated individually as required with the illumination beam to align components of the illumination-optical system and projection-lens system.

According to another representative embodiment of methods according to the invention, a segmented scattering-membrane reticle is provided in which the features are defined by corresponding regions of a material that highly scatters charged particles of an illumination beam passing therethrough. The material is layered on a reticle membrane that is transmissive to charged particles in the illumination beam without scattering the charged particles. As in the first representative embodiment, the reticle comprises a black subfield and a white subfield each sized similarly to an exposure unit of the reticle. The reticle is placed at an axial location at which the black and white subfields can be individually illuminated by the illumination beam in a manner similarly to illumination of an exposure unit of the reticle by the illumination beam. A contrast aperture, serving to block passage therethrough of charged particles of the patterned beam scattered by passage through the reticle, is placed substantially at a beam-convergence plane of the projection lens. (Such a plane is also the Fourier plane of a plane defined by the reticle.) The contrast aperture prevents the scattered particles from propagating to the sensitive substrate. The white and black subfields are selectively illuminated individually as required with the illumination beam to align components of the illumination-optical system and projection-lens system.

The "white subfield" referred to above is a subfield in which, when illuminated by the illumination beam, the illumination beam passes through the entire subfield without being significantly scattered. Thus, in a scattering-stencil reticle, a white subfield is a completely cut-out subfield. In a scattering-membrane reticle, a white subfield consists only of the reticle membrane and lacks any regions including a layer of a highly scattering material. The "black subfield" referred to above is a subfield in which, when illuminated by the illumination beam, the illumination beam is intensely scattered during passage through the subfield. Thus, in a scattering-stencil reticle, a black subfield lacks cutouts. In a scattering-membrane reticle, a black subfield consists of the reticle membrane completely overlaid with a layer of the highly scattering material. Optical axial alignments and adjustments are performed while directing the illumination beam to be incident individually on the white subfield and the black subfield.

The foregoing and additional features and advantages of the invention will be more readily apparent from the following detailed description, which proceeds with reference to the accompanying drawings.

DETAILED DESCRIPTION

Figure 3:
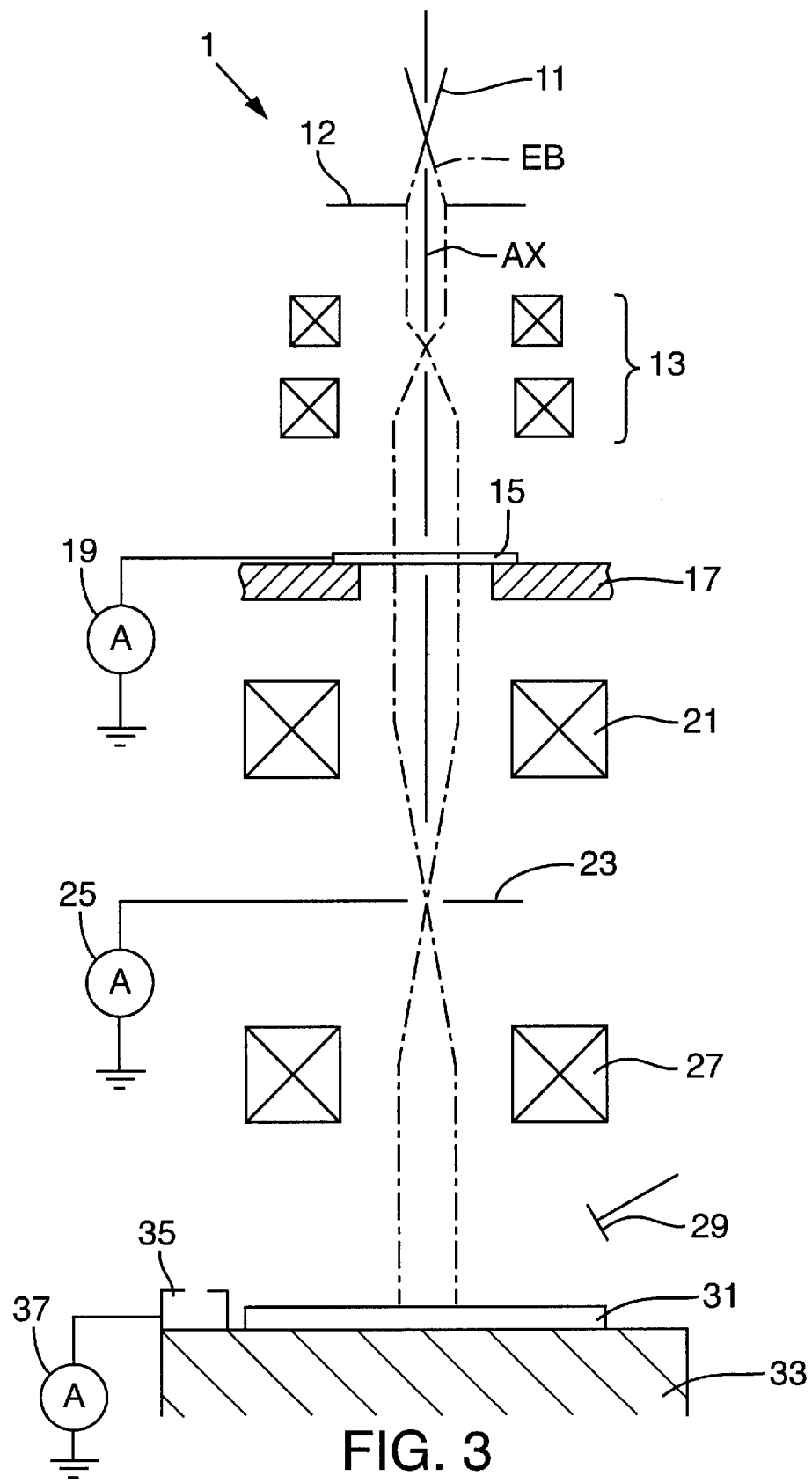
FIG. 3 is a schematic elevational optical diagram of an electron-optical system as used in an electron-beam (as a representative charged particle beam) microlithography apparatus according to a representative embodiment. Also shown are the configurations of the various sensors usable in performing axial alignment of the beam according to the invention.

Certain aspects of a representative embodiment of an electron-beam (as an exemplary charged particle beam) microlithographic exposure apparatus according to the invention are depicted in FIG. 3. An electron beam EB is produced by an electron gun 11 situated at the extreme upstream end of the electron-optical system shown in the figure. The electron gun 11 desirably comprises a $LaB_6$ cathode with an acceleration voltage of 100 kV.

The electron beam EB propagating between the electron gun 11 and the reticle 15 is termed an "illumination beam" that propagates downstream of the electron gun 11 along an optical axis AX through a beam-shaping aperture 12. The beam-shaping aperture 12 defines an opening of a particular transverse dimension and profile (e.g., square). A first condenser lens (not shown) is disposed upstream of the beam-shaping aperture 12. The illumination beam passing through the beam-shaping aperture 12 is converged and then collimated by passing through condenser lenses 13 of an illumination-optical system. The beam then impinges on the reticle 15.

The illumination-optical system extends between the electron gun 11 and the reticle 15. It will be understood that the illumination-optical system includes a blanking deflector or blanking aperture, as well as various deflectors as required (not shown).

The reticle 15 is mounted on a reticle stage 17 that is movable within a plane perpendicular to the optical axis AX. The reticle 15, in this embodiment, is a 3 $\mu$m thick monocrystalline silicon (Si) scattering stencil mask. The dimensions of the illumination beam striking the reticle (i.e., the dimensions of the "illumination field") are $(200 \,\mu m)^2$, and the beam current is 50 $\mu$A. For measuring the beam current absorbed by the reticle, an ammeter 19 is connected to the reticle 15.

The beam passing through the illuminated portion of the reticle 15 and propagating further downstream is termed the "patterned beam." The patterned beam produces a demagnified ("reduced") image of the illuminated portion of the reticle on a substrate 31 (e.g., semiconductor wafer) by passing through a first projection lens 21 and a second projection lens 27. The projection lenses 21, 27 comprise a two-stage projection lens of the projection-optical system (wherein the "projection-optical system" extends between the reticle 15 and the substrate 31). The length of the projection-optical system (i.e., the axial distance from the reticle 15 to the substrate 31) is 500 mm and the demagnification ratio is 1/5 in this embodiment. (The "demagnification ratio" is the ratio of the size of the image on the substrate to the size of the corresponding illuminated region on the reticle 15.)

A contrast aperture 23 is disposed between the first and second projection lenses 21, 27 in the vicinity of a Fourier plane of the reticle 15. The contrast aperture 23 in this embodiment has a 150 $\mu$m diameter circular opening defined in a 1-mm thick tantalum (Ta) plate. The contrast aperture 23 blocks scattered electrons that have passed through the reticle 15. The aperture diameter of the contrast aperture is determined so that the image contrast (i.e., the ratio of electrons passing through the relatively non-scattering regions of the reticle to electrons passing through highly scattering regions of the reticle) is 95% or greater. In the electron-optical system of FIG. 1, an image of the illuminated portion of the reticle 15 is formed on the plane defined by the contrast aperture 23.

An ammeter 25 is connected to the contrast aperture 23 to measure current, from the patterned beam, absorbed by the contrast aperture 23.

The substrate is mounted on a substrate stage 33 that is movable in a plane perpendicular to the optical axis AX. A resist is applied as a "sensitive" layer to the "top" (upstream-facing) surface of the substrate 31. The resist layer is imprintable with the demagnified image of the pattern, defined by the reticle 15, transferred by the projection lenses 21, 27. A backscattered-electron detector 29 is situated "above" (upstream of) and at an angle to the substrate stage 33. The backscattered-electron detector 29 detects electrons of the patterned beam that are backscattered by the substrate 31.

A Faraday cup 35 is disposed at an edge of the top surface of the reticle stage 33. The Faraday cup 35 measures the current of the electron beam reaching the reticle stage 33. For such purpose, an ammeter 37 is connected to the Faraday cup 35.

Figure 1:
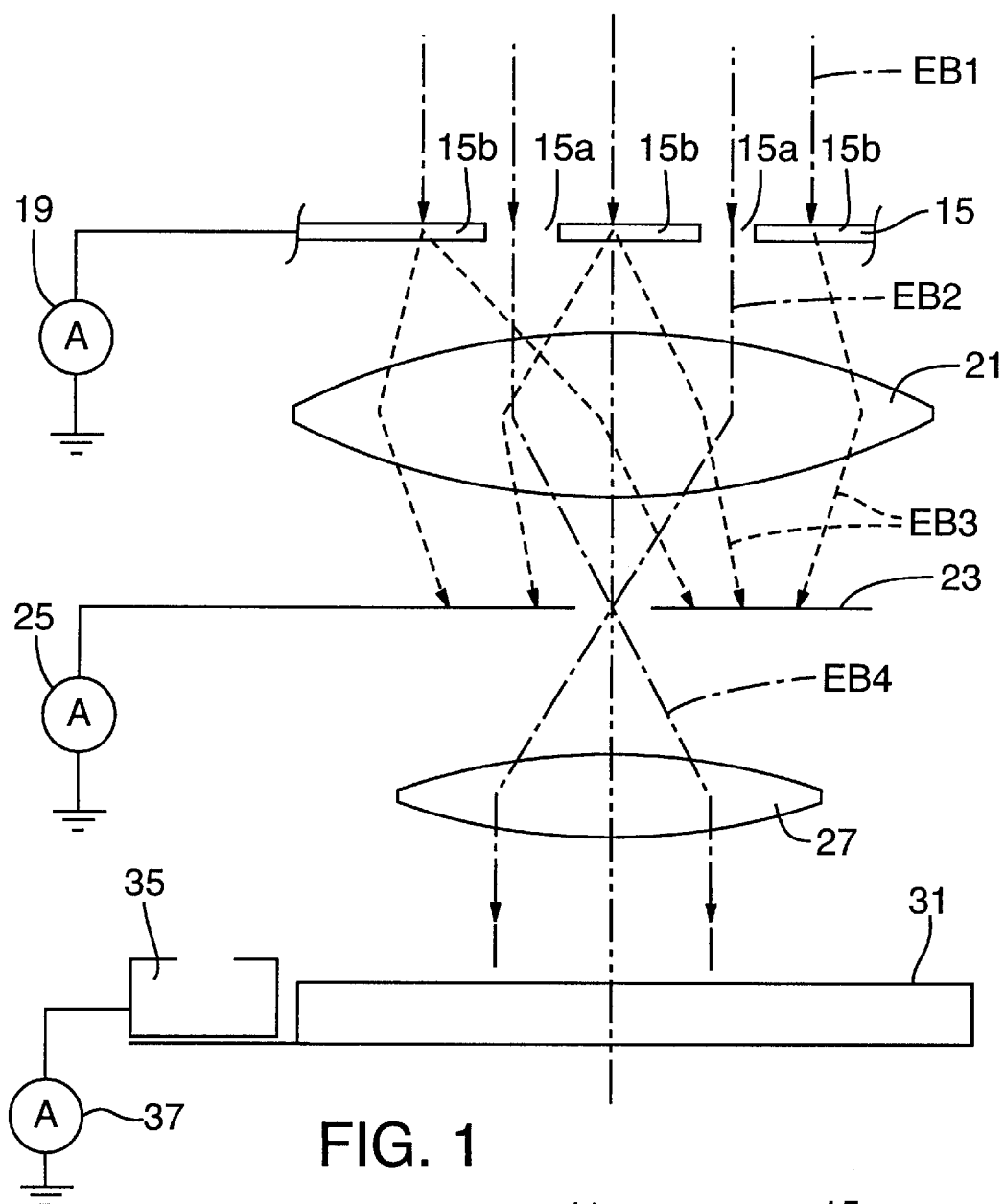
FIG. 1 schematically depicts the behavior of electrons at the reticle and in the projection-optical system of the electron-beam microlithographic projection-exposure apparatus of FIG. 3.

FIG. 1 schematically depicts the behavior of electrons passing through a segmented scattering-stencil reticle 15 and through the projection-optical system of the FIG. 3 apparatus. The reticle 15 is irradiated from upstream by electrons EB1 of the illumination beam. Electrons EB2 of the patterned beam that have passed through the cutouts 15a of the reticle 15 (and are thus not scattered) are focused by the first projection lens 21 to pass through the contrast aperture 23. The electrons EB4 passing through the contrast aperture 23 form an image on the substrate 31 by means of the second projection lens 27.

Meanwhile, most of the electrons EB1 striking the membrane portion (silicon membrane) 15b of the reticle 15 pass through the membrane portion and are scattered. The scattered electrons EB3 are also subjected to the focusing action of the first projection lens 21. However, due to their being scattered by passage through the reticle, most of the electrons EB3 strike portions of the contrast aperture 23 other than the actual opening; such electrons are absorbed by the contrast aperture 23 and thus do not proceed to the substrate 31.

Thus, contrast is obtained in the projected image on the substrate 31 by means of the contrast aperture 23.

Figure 2:
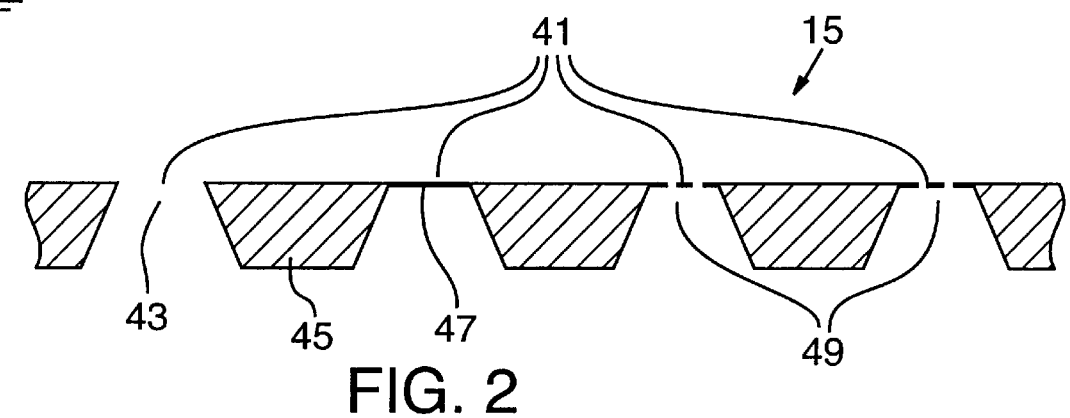
FIG. 2 is a schematic vertical section of a reticle as used in a beam-adjustment method according to an example embodiment of the invention.

FIG. 2 shows a representative structure of a reticle 15 used in an adjustment method according to the invention. The reticle 15 is divided into multiple subfields 41. The subfields 41 are separated from each other by struts 45 that form a relatively rigid framework and provide physical support for the reticle. Membrane portions (bold horizontal lines in the figure) normally extend between adjacent struts to form the respective subfields 41.

The reticle 15 shown in FIG. 2 includes a "white" subfield 43 that lacks any membrane portion (i.e., the white subfield 43 is a full-width opening between the adjacent struts 45). The reticle 15 also includes a "black" subfield 47 formed by an intact membrane (having no cutouts or other openings) extending between the adjacent struts. Details of performing axial alignments using the white subfield 43 and the black subfield 47 are discussed further below. The white subfield 43 and the black subfield 47 are illuminated with the illumination beam as required for performing axial-alignment adjustments. The reticle 15 also comprises many subfields 49 of which the respective membrane portions include feature-defining cutouts.

A representative embodiment of a procedure, according to the invention, for performing an axial alignment of the beam is now explained. Representative guidelines for axial alignment are as follows:

(1) The center of a subfield relative to the illumination-beam side is determined using the black subfield.

(2) The beam, after passing through a white subfield, passes through the center of the contrast aperture.

(3) The focal position of the first projection lens is determined using the black subfield.

(4) The focal position at the substrate is determined using the white subfield.

Details of steps of the representative embodiment are described below:

In the first step, the optical axis of the projection-exposure apparatus is roughly aligned under beam-diameter conditions that are similar to such conditions prevailing during actual exposure. Typically, the various lenses and deflectors of the optical system are adjusted to cause the beam to strike a reference position (Faraday cup 35) on the substrate stage. In addition, the dimensions of the beam as incident on the substrate are adjusted by adjusting the second projection lens so that the transverse profile of the beam fits inside the Faraday cup 35.

In the second step, the reticle stage is actuated to move the black subfield 47 on the reticle 15 onto the optical axis AX. The lenses and deflectors of the illumination-optical system are then adjusted, while scanning the illumination beam on the black subfield 47 and measuring the current absorbed by the reticle using the ammeter 19, until the entire illumination beam falls within the black subfield. I.e., such adjustment is continued until the center of the illumination beam is coincident with the center of the black subfield (at which time the current measured by the ammeter 19 is at a minimum). (It is noted that electrons incident on a strut are detectable as current, but electrons incident on the membrane are scattered and thus not detected as current.) Then, the condenser lenses 13 are adjusted until the transverse dimensions and profile of the illumination beam are as used during an actual exposure.

In the third step, the white subfield is moved to the same subfield position previously occupied by the black subfield in the second step. I.e., the white subfield is moved to the optical-axis position. Meanwhile, the Faraday cup 35 is positioned on the optical axis (to serve as the substrate-stage reference position) to allow measurements of the current received at the pattern-imaging surface (top surface) of the substrate 31. The second projection lens 27 is adjusted to maximize the beam current entering the Faraday cup 35.

In the fourth step, the focal position of the first projection lens 21 (that focuses the electron beam on the contrast aperture 23) is adjusted as required along the three axes (X, Y, Z axes) to determine a position (lens condition) at which the current as measured at the contrast aperture 23 (using ammeter 25) is lowest. Afterward, the position of the Faraday cup is finely adjusted while simultaneously readjusting the second projection lens 27 so as to maximize the beam current entering the Faraday cup 35.

In a fifth step, the reticle 15 is moved to place the black subfield 47 on the optical axis (the same position as in the second step). The current absorbed by the reticle (as measured using ammeter 19) is then minimized at this position by making appropriate adjustments of the illumination-optical system.

In a sixth step, the beam focal position is adjusted as required along the optical axis using the first projection lens 21. While making this adjustment, the position at which the current absorbed by the contrast aperture 23 is maximum is deemed the desired set position (set lens condition) for the first projection lens 21. In addition, a confirmation is made that the current at the Faraday cup 35 is essentially 0 [zero].

In a seventh step, the white subfield is returned to the optical-axis position. The second projection lens 27 is used to adjust the beam convergence position as required along the optical axis. The axial position at which the current at the Faraday cup is at a maximum is deemed the desired set position for the second projection lens.

In an eighth step, the best-focus position for the second projection lens is determined by adjusting the exposure parameters (focus of the second projection lens, illumination dose, parameters of the various aberration compensators and dynamic-focus lenses, etc.) as required to establish exposure settings for an actual exposure pattern.

EXAMPLE

Lens axes were adjusted by performing the adjustments to the electron-optical system as described in steps (1)–(3), above, using the white subfield 43 and black subfield 47. The focus of the second projection lens 27 was adjusted as required to maximize the beam current received by the Faraday cup 35. In this example, that current was 48 $\mu$A.

Steps (5), (6), and (7), above, were performed so that the focal positions of the first projection lens were essentially the same at two different reticle positions. Focus adjustment for the first projection lens 21 was deemed completed when these focal positions were found to be the same. Under such conditions the currents absorbed by the contrast aperture 23 and by the Faraday cup 35 were 45 $\mu$A and 0.2 $\mu$A, respectively.

Finally, a reticle pattern was positioned for exposure. The pattern was exposed while adjusting the actual focal position of the second projection lens as required for determining an optimal focal position for the pattern image.

Even though the method embodiment described above pertained to adjustment of an electron-beam microlithography apparatus employing a scattering-stencil mask, it will be understood that the adjustment can be performed with equal facility with a scattering membrane reticle.

As is clear from the foregoing description, the feature density of a reticle can be measured, according to the invention, since it is possible to collect a proportion of electrons scattered by the mask and the blocking efficiency of scattered electrons. This invention, therefore, has the advantage of being able to perform inspections for reticle defects, etc., without having to remove the reticle from the microlithography apparatus.

Whereas the invention has been described in connection with a representative embodiment and an example, it will be understood that the invention is not limited to that embodiment. On the contrary, the invention is intended to encompass all modifications, alternatives, and equivalents as may be included within the spirit and scope of the following claims.

What is claimed is:

1. A method for performing a beam alignment in a charged-particle-beam microlithography apparatus that includes an illumination-optical system that illuminates a region of a segmented reticle defining a pattern of features to be transferred to a sensitive substrate using an illumination beam, and a projection-lens system that projects a patterned beam, formed by passage of the illumination beam through the illuminated region of the reticle, carrying an image of the illuminated region onto the sensitive substrate, the method comprising:

(a) providing a segmented scattering-stencil reticle in which the features are defined by corresponding cutouts in a reticle membrane that transmits the illumination beam but scatters particles in the illumination beam as the illumination beam passes through the reticle membrane, the reticle comprising a black subfield and a white subfield each sized similarly to an exposure unit of the reticle;

(b) placing the reticle at an axial location at which the black and white subfields can be individually illuminated by the illumination beam in a manner similarly to illumination of an exposure unit of the reticle by the illumination beam;

(c) placing a contrast aperture, that blocks passage therethrough of charged particles of the patterned beam scattered by passage through the reticle, substantially at a beam-convergence plane of the projection lens, which plane is a Fourier plane of a plane defined by the reticle, in the projection lens system, the contrast aperture preventing the scattered particles from propagating to the sensitive substrate; and (d) selectively illuminating the white and black subfields individually as required with the illumination beam to align components of the illumination-optical system and projection-lens system.

2. The method of claim 1, further comprising:
    providing a substrate stage on which the substrate is mounted for exposure; and
    providing a reference position on the substrate stage.

3. The method of claim 2, further comprising the step, before step (d), of aligning the illumination-optical system and the projection-lens system to cause the patterned beam to strike the reference position.

4. The method of claim 3, wherein the projection-lens system comprises first and second projection lenses, the method further comprising the step of adjusting the second projection lens to cause the patterned beam to fit inside the reference position.

5. The method of claim 2, wherein step (d) further comprises:
    illuminating the black subfield with the illumination beam;
    while scanning the illumination beam on the black subfield, measuring an electrical current absorbed by the reticle; and
    adjusting the illumination-optical system until the electrical current absorbed by the reticle is at a minimum.

6. The method of claim 2, wherein step (d) further comprises:
    illuminating the white subfield with the illumination beam;
    measuring an electrical current absorbed at the reference position; and
    adjusting a projection lens of the projection-lens system until the electrical current absorbed at the reference position is at a maximum when using the white subfield.

7. The method of claim 2, wherein:
    the projection-lens system comprises first and second projection lenses; and
    step (d) further comprises illuminating the white subfield with the illumination beam, and adjusting the first projection lens until an electrical current absorbed by the contrast aperture is at a minimum.

8. The method of claim 7, wherein step (d) further comprises:
    illuminating the black subfield with the illumination beam; and
    adjusting the illumination-optical system until an electrical current absorbed by the reticle is at a maximum.

9. The method of claim 8, wherein step (d) further comprises:
    adjusting the first projection lens until an electrical current absorbed by the contrast aperture is at a maximum; and
    confirming that an electrical current absorbed at the reference position is essentially zero.

10. The method of claim 9, wherein step (d) further comprises:
    illuminating the white subfield; and
    adjusting the second projection lens until an electrical current absorbed at the reference position is at a maximum.

11. The method of claim 1, wherein the charged particles in the illumination beam and patterned beam are electrons.

12. A method for performing a beam alignment of a charged-particle-beam microlithographic exposure apparatus that includes an illumination-optical system that illuminates a region of a segmented reticle defining a pattern of features to be transferred to a sensitive substrate using an illumination beam, and a projection-lens system that projects a patterned beam, formed by passage of the illumination beam through the illuminated region of the reticle, carrying an image of the illuminated region onto the sensitive substrate, the method comprising:

(a) providing a segmented scattering-membrane reticle in which the features are defined by corresponding regions of a material that highly scatters charged particles of an illumination beam passing therethrough, the material being layered on a reticle membrane that is transmissive to charged particles in the illumination beam without scattering the charged particles, the reticle comprising a black subfield and a white subfield each sized similarly to an exposure unit of the reticle;

(b) placing the reticle at an axial location at which the black and white subfields can be individually illuminated by the illumination beam in a manner similarly to illumination of an exposure unit of the reticle by the illumination beam;

(c) placing a contrast aperture, that blocks passage therethrough of particles of the patterned beam scattered by passage through the reticle, substantially at a beam-convergence plane of the projection lens, which plane is a Fourier plane of a plane defined by the reticle, in the projection-lens system, the contrast aperture preventing the scattered particle from propagating to the sensitive substrate; and (d) selectively illuminating the white and black subfields individually as required with the illumination beam to align components of the illumination-optical system and projection-lens system.

13. The method of claim 12, further comprising:

providing a substrate stage on which the substrate is mounted for exposure; and providing a reference position on the substrate stage.

14. The method of claim 13, further comprising the step, before step (d), of aligning the illumination-optical system and the projection-lens system to cause the patterned beam to strike the reference position.

15. The method of claim 14, wherein the projection-lens system comprises first and second projection lenses, the method further comprising the step of adjusting the second projection lens to cause the patterned beam to fit inside the reference position.

16. The method of claim 13, wherein step (d) further comprises:

illuminating the black subfield with the illumination beam;

while scanning the illumination beam on the black subfield, measuring an electrical current absorbed by the reticle; and adjusting the illumination-optical system until the electrical current absorbed by the reticle is at a minimum.

17. The method of claim 13, wherein step (d) further comprises:

illuminating the white subfield with the illumination beam;

measuring an electrical current absorbed at the reference position; and adjusting a projection lens of the projection-lens system until the electrical current absorbed at the reference position is at a maximum.

18. The method of claim 13, wherein:

the projection-lens system comprises first and second projection lenses; and step (d) further comprises adjusting the first projection lens until an electrical current absorbed by the contrast aperture is at a minimum when using the white subfield.

19. The method of claim 18, wherein step (d) further comprises:

illuminating the black subfield with the illumination beam; and adjusting the illumination-optical system until an electrical current absorbed by the reticle is at a maximum.

20. The method of claim 19, wherein step (d) further comprises:

adjusting the first projection lens until an electrical current absorbed by the contrast aperture is at a maximum; and confirming that an electrical current absorbed at the reference position is essentially zero.

21. The method of claim 20, wherein step (d) further comprises:

illuminating the white subfield; and adjusting the second projection lens until an electrical current absorbed at the reference position is at a maximum.

22. The method of claim 12, wherein the charged particles in the illumination beam and patterned beam are electrons.

* * * * *